United States Patent [19]
Hansen

[11] Patent Number: 5,353,114
[45] Date of Patent: Oct. 4, 1994

[54] OPTO-ELECTRONIC INTERFEROMETIC LOGIC

[75] Inventor: Per B. Hansen, Middletown, N.J.

[73] Assignee: AT&T Bell Laboratories, Murray Hill, N.J.

[21] Appl. No.: 981,955

[22] Filed: Nov. 24, 1992

[51] Int. Cl.$^5$ ............................................... G01B 9/02
[52] U.S. Cl. ........................................ 356/345; 385/14
[58] Field of Search ................. 356/345, 73.1; 385/14, 385/4; 250/227.19, 227.27

[56] References Cited

U.S. PATENT DOCUMENTS

| | | | |
|---|---|---|---|
| 4,763,974 | 8/1988 | Thaniyavarn | 356/345 |
| 4,878,723 | 11/1989 | Chen et al. | 356/345 |
| 5,034,603 | 7/1991 | Wilson | 356/345 |
| 5,162,869 | 11/1992 | Michel et al. | 356/345 |
| 5,185,830 | 2/1993 | Nishimoto | 385/14 |
| 5,214,726 | 5/1993 | Hockaday | 385/14 |
| 5,253,309 | 10/1993 | Nazarathy et al. | 385/4 |

*Primary Examiner*—Samuel A. Turner
*Assistant Examiner*—Russell C. Wolfe
*Attorney, Agent, or Firm*—Gerard A. deBlasi

[57] ABSTRACT

In this invention, an optical beam is multiplexed with two independently generated electrical pulse signals applied simultaneously to an interferometer having at least two branches to perform electrical-to-optical operations, such as logic, encryption or multiplexing operations. A Y junction interferometer which is coupled to receive a CW or periodic occurring optical beam has at least one set of individually addressable contacts. A first pair of individually addressable contacts is coupled to receive a first independently generated electrical pulse signal of a given frequency and amplitude, and a second pair of individually addressable contacts coupled to the same or another branch of the Y is coupled to receive a second independently generated electrical pulse signal of a given frequency and amplitude which is other than substantially identical to and other than substantially in-phase inverse with the first signal. The output optical signal is a signal representative of optical pulses of the logic, encryption or multiplexing operation.

21 Claims, 6 Drawing Sheets

OPTO-ELECTRONIC INTERFEROMETIC LOGIC

TECHNICAL FIELD

This invention relates to optical communications.

BACKGROUND OF THE INVENTION

Optical communications techniques are being used increasingly in commercial communications applications. Moreover, the designers of optical communication systems continue to focus on techniques for increasing the transmission capacity of such systems. The current state of the art is such that per-channel data rates in the 10–20 gigabit per second (Gbit/s) range have been demonstrated.

The attainable data rates are limited principally by electrical signal processing considerations. In particular, electronic logic and other digital circuitry capable of operating at the highest rates that are attainable at any point in the evolution of the technology are typically not only expensive to design but are difficult to produce. Moreover, technology capable of providing the highest attainable speed is typically not sufficiently mature to guarantee reliable long-term operation.

SUMMARY OF THE INVENTION

The present invention provides a technique which can ameliorate the above-described problem in a variety of optical communications applications. In accordance with the invention, at least two branches of an optical interferometer are controlled by respective time-varying electrical signals. As a departure from the prior art, those signals are other than substantially a) identical to, or b) in-phase inverses of each other. The constructive/destructive interference between the optical signals in the branches that results from using such signals to control the interferometer is such that, advantageously, any of a variety of functionalities are provided while eliminating at least some signal processing that heretofore had to be carried out in the electrical domain. For example, electrical signals that would have had to have been processed at a desired output optical data rate can, by using the invention, be processed at a much lower, e.g., 50% lower rate, thereby ameliorating the electrical circuitry limitations described above.

The invention may be used, for example, to multiplex N data signals, each having a data rate of B Gbit/s, to generate an optical signal encoded at N×B Gbit/s, the N data signals being applied with appropriate time-domain offsets to N control electrodes of the interferometer. Advantageously, the N constituent data signals are readily recovered from the output optical signal using only B Gbit/s logic circuitry.

The invention may also be used, for example, to generate an optical signal which carries data, the value of which is a Boolean or other logic combination of the controlling electrical signals. Thus, for example, encryption can be carried out by using a data signal at B Gbit/s as one of the controlling electrical signals and a signal representing a predetermined bit pattern at that same data bit rate as a second controlling electrical signal. In this application, the data rate of the output optical signal is also B Gbit/s.

Advantageously, the two above-described or other functionalities can be carried out using a single interferometer by using a first set of electrodes to implement one of the functionalities, such as the multiplexing and using a second set of electrodes to implement the other one of the functionalities, such as the encryption. The electrodes of each set may be electrodes which control respective different branches of the interferometer or, in other embodiments may be electrodes which control a particular one branch of the interferometer. Combinations of these two approaches are also possible.

The interferometer, in carrying out the above and other functions implements an exclusive-OR/NOR functionality vis-a-vis the controlling electrical signals. That is, the constructive/destructive interference between the optical signals in the branches is such that the signals in the interferometer branches combine constructively (destructively)-thereby providing a first (second) optical output level—when the logic levels of an even (odd) number of the controlling electrical signals are "high." Moreover, in accordance with a feature of the invention, the optical output state can be negated by, for example, applying a constant offset signal to an electrode in order to induce a constant phase delay in the associated branch. By invoking this mechanism, the negation of an exclusive-OR function, i.e., an exclusive-NOR function, is achieved. Advantageously, then the invention could, if desired, be used strictly to provide at least some electrical-to-optical Boolean logic functions.

DETAILED DESCRIPTION

Figure 1:
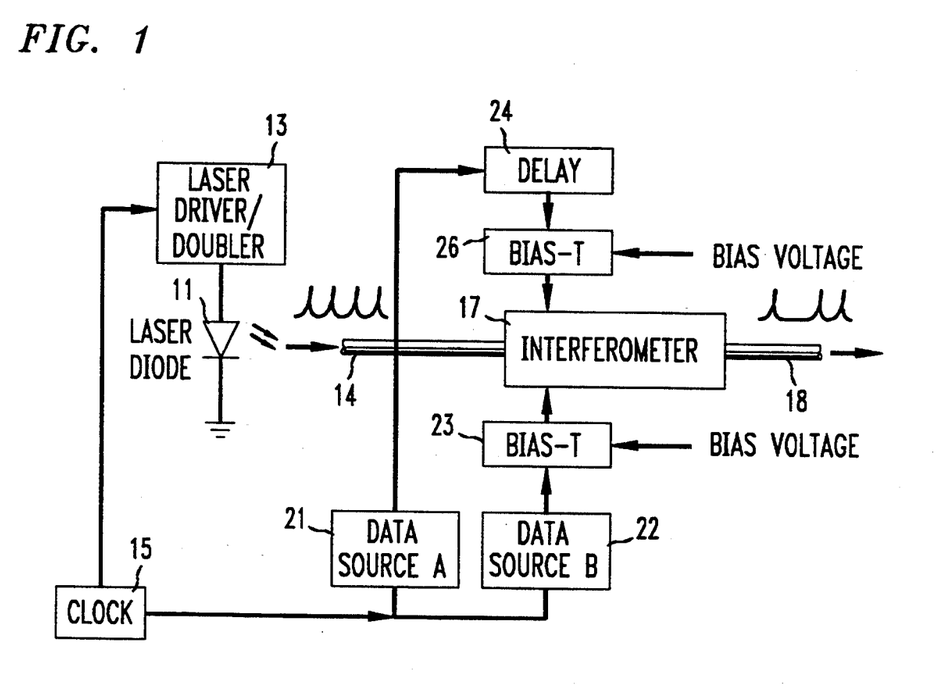
FIG. 1 is a block diagram of a transmitter in accordance with the principles of the invention.

A transmitter for multiplexing data signals to generate an optical signal in accordance with the principles of the invention is shown in FIG. 1. A laser diode 11 generates an optical return-to-zero (RZ) signal, which means that the optical power starts and ends at zero within each of a succession of signaling intervals (bit periods). The optical signal is applied via optical fiber 14 to interferometer 17. The output at the latter is applied to output optical fiber 18. The RZ signal is modulated by data signals provided from data source A, 21, and from data source B, 22. The data sources are clocked from a clock 15 at an illustrative clock rate of 5 GHz. The clock signal from clock 15 is also applied to laser driver/doubler 13 which drives laser diode 11 in such a way as to provide a 10 GHz RZ optical signal. That is, the optical signal from laser diode 11 is comprised of optical pulses which repeat at a 10 GHz rate. The output of data source 21 is applied to interferometer 17 via delay element 24 and bias-T26. The output of data source 22 is applied to interferometer 17 via bias-T23.

The function of bias-T23 and bias-T26 is to combine the signal levels of either one or both of the data signals with respective bias voltage signals, the purpose of which is explained at a more opportune point hereinbelow. The function of delay element 24 is to adjust the relative phases of the data signals from the data sources 21, 22.

Figure 2:
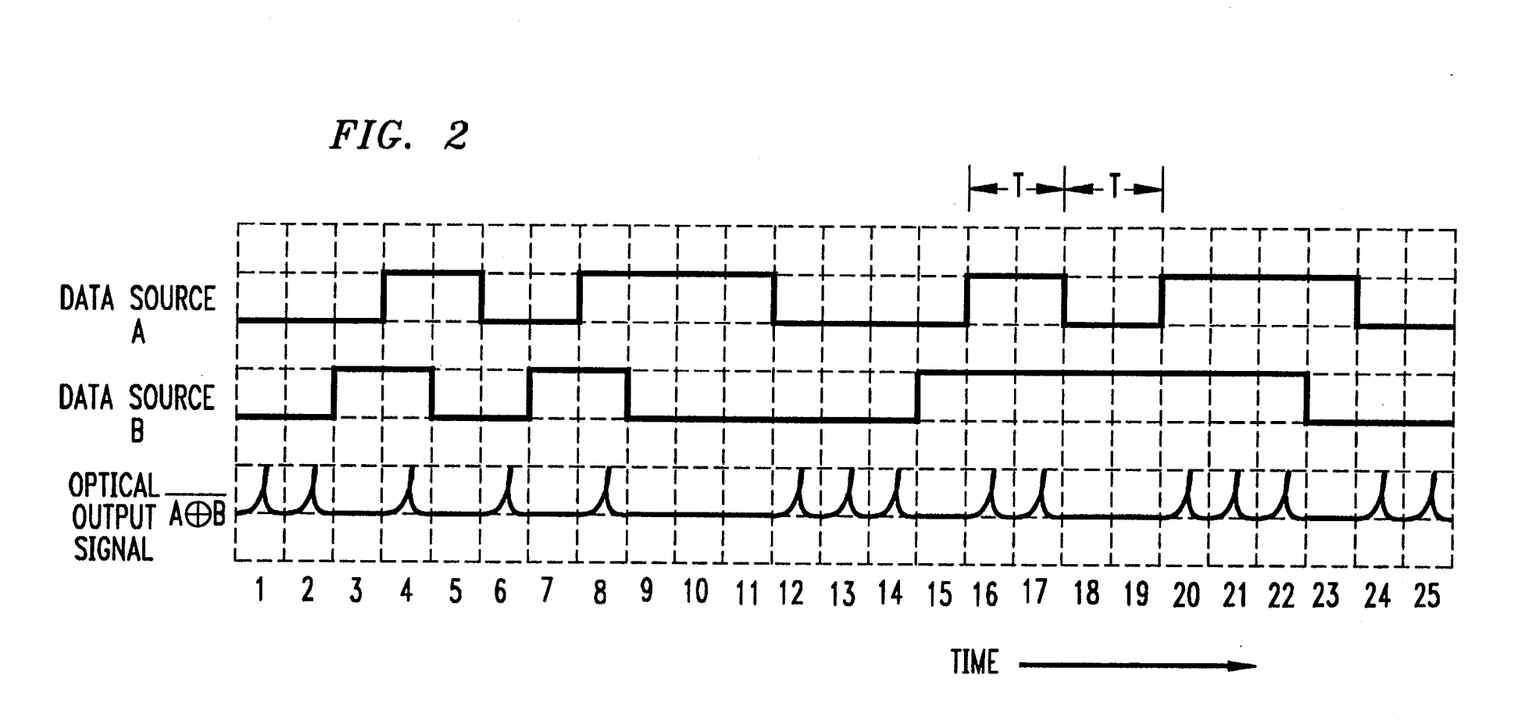
FIG. 2 is a timing diagram illustrating the use of the invention for a logic function.

More particularly, FIG. 2 shows illustrative outputs of data sources A and B. The clock, or bit, period is T, i.e., 1/5 GHz=200 ps. The delay imparted by delay element 24 is adjusted to take into account any inherent phase difference between the outputs of the two data sources in such a way that the signal from data source A is delayed by half a bit period relative to the signal from data source B. In accordance with the invention interferometer 17 multiplexes these two signals to form the exclusive-NOR function thereof. Thus, as also shown in FIG. 2 the optical output signal A & B includes an optical pulse in each half-bit period for which the values of the two data signals are the same, i.e., both are "high" or both are "low", and has no optical pulse in each half-bit period for which the values of the two data signals are different, i.e., one "high" and one "low".

Figure 3:
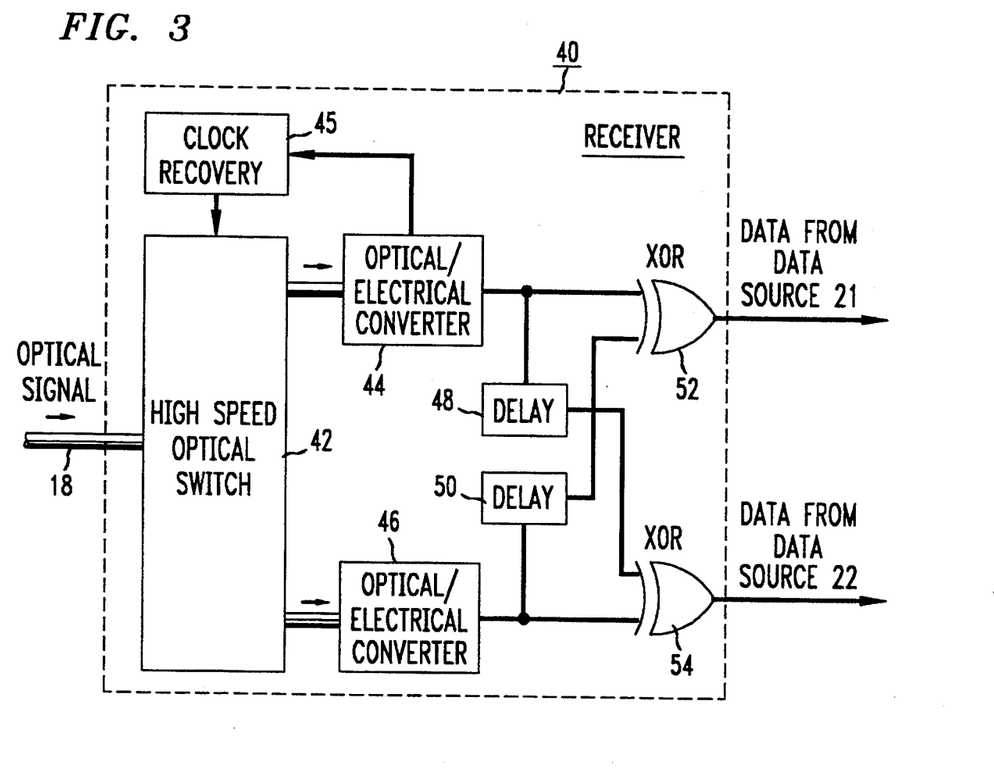
FIG. 3 illustrates a receiver which can be used with the transmitter of FIG. 1.

The output signals from the interferometer 17 are launched onto an optical fiber 18 to a remote location which can include a receiver 40. Referring to FIG. 3 there is illustrated a receiver for receiving an optical signal that was launched on optical fiber 18. The components of the receiver shown in FIG. 3 are of conventional design and functionality and therefore only a brief discussion thereof is necessary.

In particular, the 10 Gbit/s optical signal on fiber 18 is received by a high-speed optical switch 42 such as a lithium niobate directional switch operated by clock pulses from a clock recovery circuit 45 to direct the received pulses alternately to optical-to-electrical converters 44 and 46.

The optical-to-electrical converters 44, 46 operate at one half the optical transmission rate so that respective 5 Gbit/s electrical signals appear at the output of each, where the pulses in each signal represent the value of a particular pulse on fiber 18. The two output signals from the optical-to-electrical converters are phase-offset with respect to one another by T/2. This phase offset is compensated for by delay elements 48 and 50 in such a way that the bit which represents each optical pulse on fiber 18 is exclusive-ORed with the bit that represents the preceding optical pulse by one of exclusive-OR gates 52 or 54 and is exclusive-ORed with the bit that represents the succeeding optical pulse by the other one of those gates. The outputs of gates 52 and 54 are the recovered data signals from data sources A and B.

Figure 4:
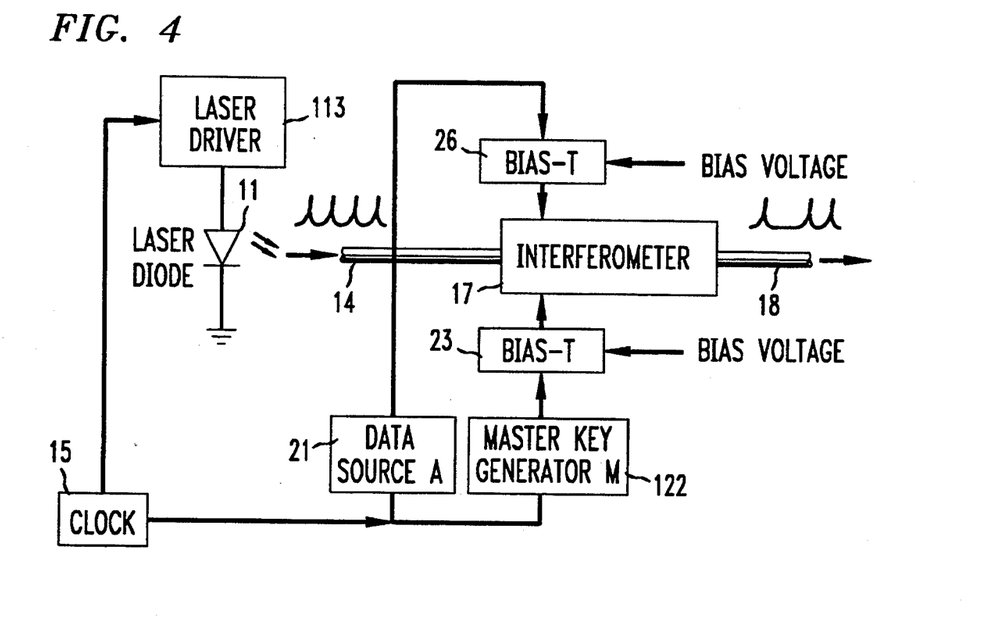
FIG. 4 illustrates an alternative embodiment of a transmitter embodying the principles of the invention.
Figure 5:
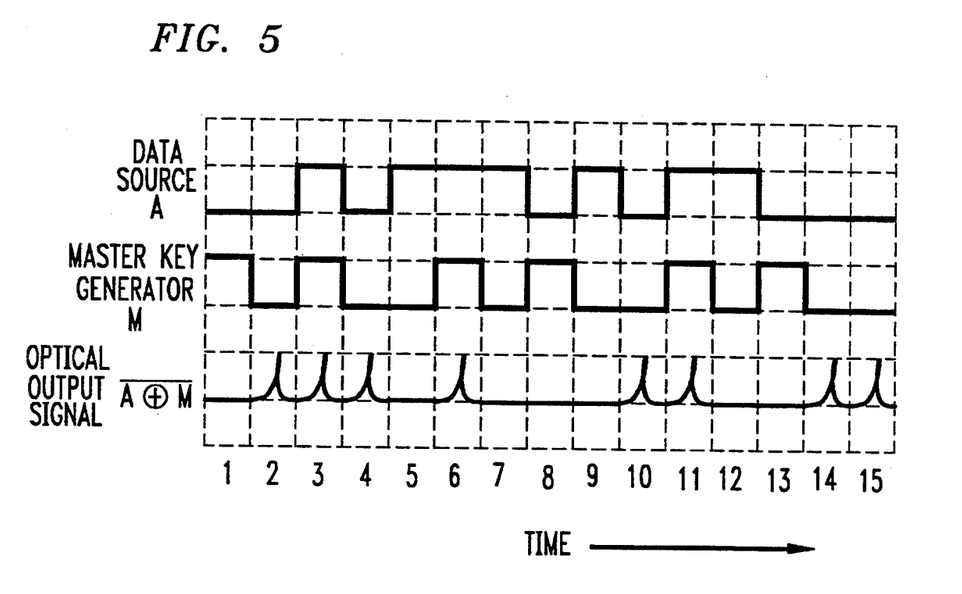
FIG. 5 illustrates the timing diagram for the transmitter of FIG. 4.

An alternative embodiment of a transmitter embodying the principles of the invention is shown in FIG. 4. Rather than multiplexing two 5 Gbit/s data signals to provide a 10 Gbit/s optical signal, this embodiment combines a single 5 Gbit/s data signal with a 5 Gbit/s fixed-bit-pattern signal, referred to as a "master key" signal, to provide a 5 Gbit/s encrypted optical signal. This embodiment is similar to that of FIG. 1 except that data source 22 is replaced by a master key generator 122 and the laser driver/doubler 13 is replaced with a laser driver 113 so that the optical pulses generated by laser diode 11 have a rate of 5 GHz. Additionally, delay element 24 is eliminated so that the outputs of data source 21 and master key generator 122 are phase-aligned. These two signals and the resulting optical output signal are shown in timing diagram FIG. 5.

Figure 6:
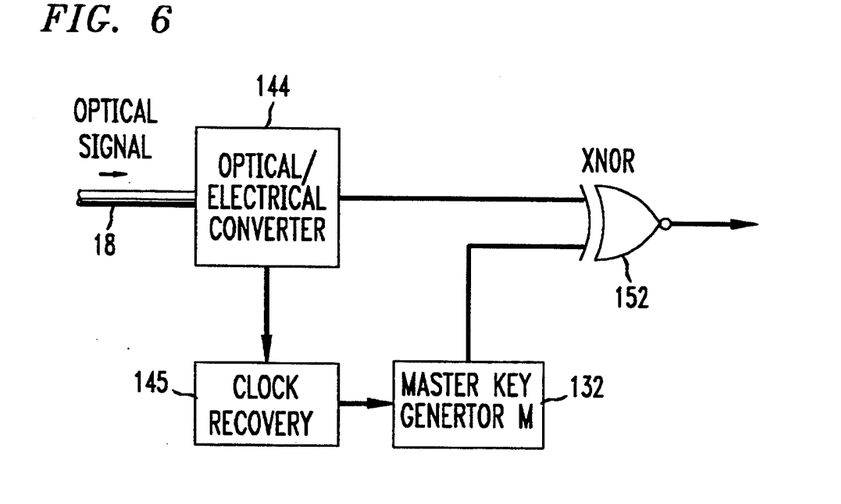
FIG. 6 is a block diagram of a receiver for the transmitter of FIG. 4.

An illustrative receiver for this embodiment is shown in FIG. 6. The optical signal on fiber 18 is converted to electrical form by optical-to-electrical converter 144 the output of which is applied to one input of exclusive-NOR gate 152. The other input of gate 152 is provided by master key generator 132 which replicates the master key signal generated in the transmitter by master key generator 122. (The bit patterns generated by master key generators 122 and 132 are brought into synchronism in accordance with well-known techniques.) Master key generator 132 is clocked from clock recovery circuit 145 which recovers the transmit clock from converter 144.

Figure 7:
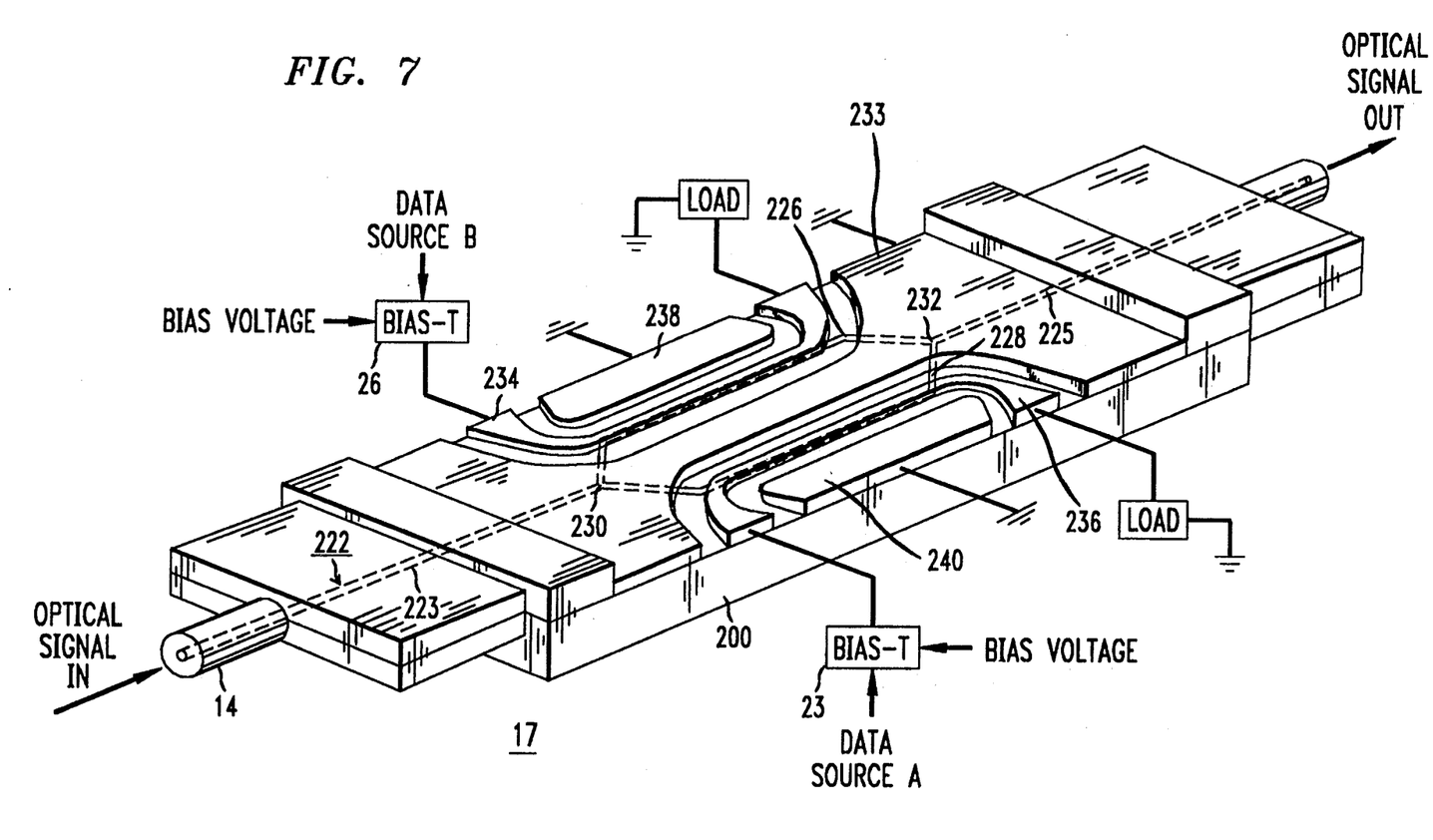
FIG. 7 is an illustrative realization of an interferometer.

An illustrative realization of interferometer 17 is shown in FIG. 7. In particular, the interferometer is comprised of an electro-optic material substrate 200 such as lithium niobate (LiNbO$_3$). An optical waveguide 222 is formed in the substrate via titanium (Ti) diffusion. The optical waveguide 222 is constructed to include two parallel branches 226, 228 positioned between two optical junctions 230, 232 which are coupled to two end waveguide sections 223, 225. The LiNbO$_3$ substrate, including the optical Y junctions, the parallel branches and the end sections, supports an SiO$_2$ buffer layer which forms a common ground plane and a set of electrodes consisting of two pairs of electrodes. The ground plane and the electrodes can be electroplated onto the buffer layer and can be of aluminum, silver, gold or the like. One pair of electrodes can comprise an elongated electrode 236 positioned over optical waveguide 228 and a ground plane 240. The other pair of electrodes can comprise a ground plane 238 and an elongated electrode 234; the electrode 234 being positioned over optical waveguide 226. A common ground plane 233 can be included to cooperate with electrodes 234, 236. The assemblage of the LiNbO$_3$ substrate, the optical Y junctions and associated optical waveguides, and a set of electrodes is one manifestation of an interferometer normally identified as a Y junction Mach-Zehnder interferometer.

In a Y junction interferometer a change in the index of refraction of the waveguides—which is a function of the voltages applied to the single set of electrodes 234, 238; 236, 240—causes an optical signal in the waveguides to experience an optical phase shift. Thus, in each branch 226, 228 the optical phase shift experienced by the optical signal in that branch is determined by the voltage applied to the electrodes associated with that branch.

In operation, the optical energy received from laser diode 11 via optical fiber 14 is directed into end section 223 of waveguide 222 where it is divided into two equal optical signals by Y junction 230. The voltage levels representing Boolean levels "0" and "1" in the applied data signals are cause to be such that changing the value of one of those signals from one of the voltage levels to the other induces a phase shift of an odd number times $\pi$. As a consequence, the signals in branches 226, 228 combine constructively when the logic levels of the signals on electrodes 234, 236 are the same—thereby providing a first, maximum, optical output level—and combine destructively when the logic levels of the signals on electrodes 234, 236 are different—thereby providing a second, minimum, optical output level. (The foregoing assumes that the various operating parameters of the interferometer are initially adjusted in such a way that the maximum optical output is achieved when the signals on electrodes 234, 236 are both at their Boolean "0".)

Assuming that a maximum optical output level would be regarded to correspond to a Boolean "1", the functionality just described will be recognized as being an exclusive-NOR function. In accordance with a feature of the invention, the negation of that function—namely, an exclusive-OR function—can be readily achieved if desired by applying an appropriate offset voltages to one or both of the bias-Ts 23, 26 in order to induce a constant phase delay into the system thereby causing destructive interference for same-valued electrical inputs and constructive interference for different-valued electrical inputs.

Figure 8:
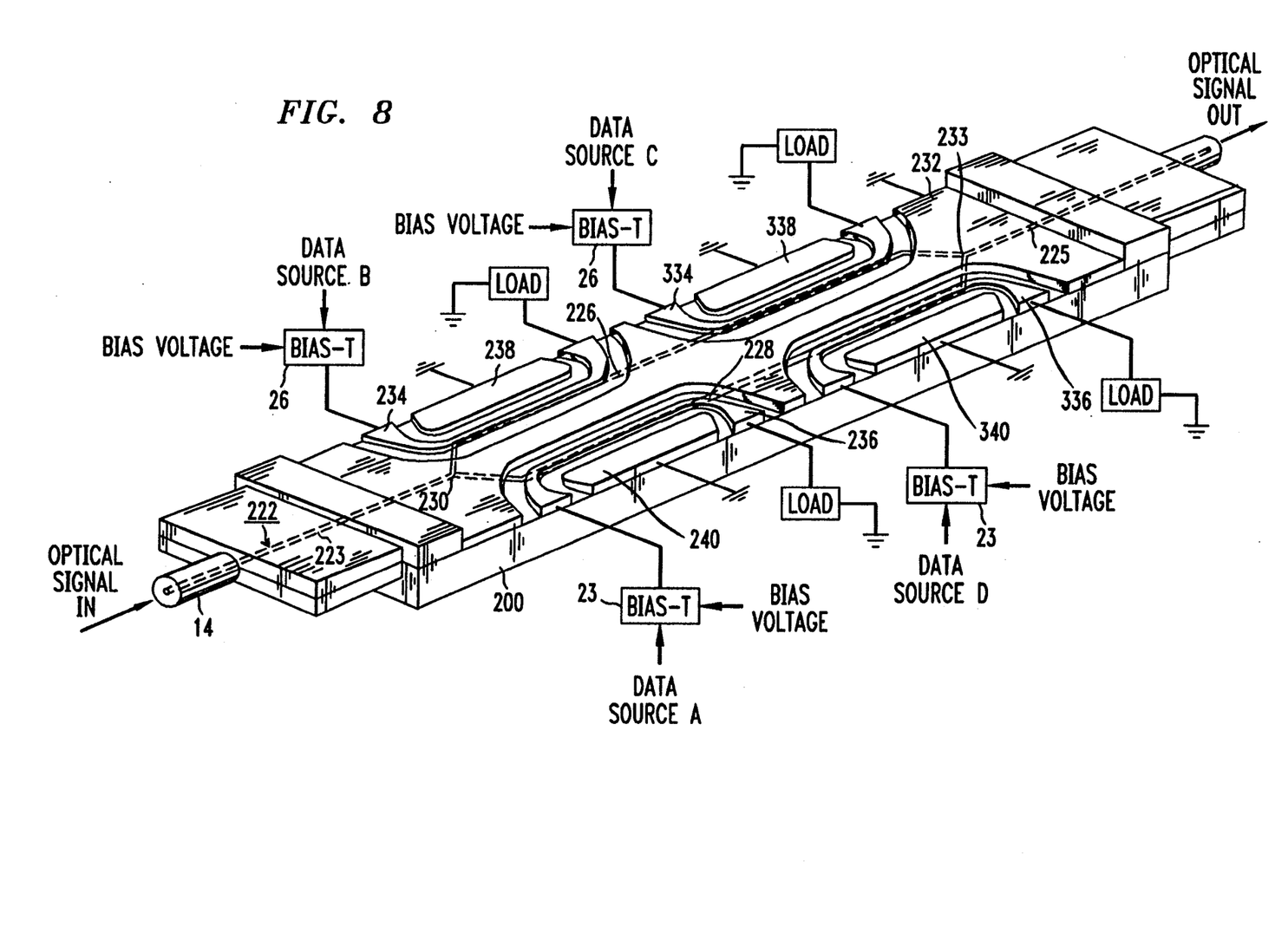
FIG. 8 is an illustrative realization of an alternative embodiment of an interferometer.

An alternative embodiment of an interferometer that can be used to realize the principles of the present invention is shown in FIG. 8. This interferometer is substantially identical to the interferometer in FIG. 7 except that a another set of electrodes 334, 338 and 336, 340 is provided for each of the two branches. Each of these pairs of electrodes induces an additional odd-number-of-half-wavelengths phase-shift when the logic level of the signal applied to it changes from a Boolean "0" to a Boolean "1". Depending upon the application one might apply a signal to two of these pairs of electrodes or to more than two of the pairs of electrodes. For example, a three-input exclusive-OR/NOR function—in which the output value depends on whether an odd or even number of inputs is "high"—can be realized by simply applying the third input to one of the pairs of electrodes 334, 338 or 336, 340. A four-input exclusive-OR/NOR function can be realized by applying the third and fourth inputs to respective ones of those sets. Another way in which the two sets of electrodes can be used is to use one set of electrodes to implement a first functionality, such as multiplexing and a second set to implement a second functionality such as encryption.

The foregoing merely illustrates the principles of the present invention. Thus, for example, any desired number of electrodes (including zero) can be provided on any branch, as long as there are at least two sets of electrodes on the other branch. Moreover, although stability issues would have to be considered, one might be able to fabricate an interferometer having more than two branches.

It should further be realized that although the invention is disclosed herein in the context of optical communications systems, the invention could, if desired, be used strictly to provide at least some electrical-to-optical Boolean logic functions such as the exclusive-OR and the exclusive-NOR functions disclosed herein.

Other variations are possible. For example, the optical signal input to the interferometer need not be a return-to-zero signal and the optical signal from the laser diode can be continuous-wave or of another form. In this context, it may be noted that the invention can also be used to generate an optical clock signal (steady stream of optical pulses). In such an embodiment, a continuous wave optical signal would be applied to the interferometer and an electrical clock signal would be used to supply both of the interferometer electrical input signals, which are delayed by an odd number quarter-periods. The frequency of the optical clock signal at the output of the interferometer would then have a frequency which is twice that of the electrical clock signal.

It will thus be appreciated that although specific embodiments of the invention are shown and described herein, those skilled in the an will be able to devise numerous other arrangements which embody the principles of the invention and are thus within its spirit and scope.

I claim:

1. A method of using an interferometer which has first and second electrodes controlling the delays of optical signals in first and second associated branches of said interferometer, respectively said method comprising step of applying to said first and second electrodes first and second time-varying electrical signals, respectively, said electrical signals being other than substantially identical to each other and being other than substantially in-phase inverses of each other.

2. The method of claim 1 wherein said interferometer further has a third electrode further controlling the delay of the optical signal in said first branch and wherein said method comprises a further step of applying to said third electrode a third time-varying electrical signal.

3. The invention of claim 1 wherein said first and second signals are respective data signals each at a data rate of B Gbit/s and having a fixed phase offset relative to one another.

4. The invention of claim 3 wherein each of said data signals has first and second levels and wherein said interferometer and said first and second levels are such that the delays induced in a particular branch in response to the first and second levels of the electrical signal applied to the electrode associated with that branch differ by an odd number of half wavelengths of the optical signal in that branch.

5. The invention of claim 3 wherein each of said data signals has first and second levels and wherein said interferometer and said first and second levels are such that the optical signals in the first and second branches combine constructively when the levels of said data signals are the same, and combine destructively when the levels of said data signals are different.

6. The invention of claim 1 wherein in said interferometer the optical signals in said first and second branches are combined to provide an optical output signal.

7. The invention of claim 6 wherein in said interferometer an input optical signal is divided and applied to said first and second branches.

8. The invention of claim 3 wherein each of said data signals has first and second levels and wherein said interferometer and said first and second levels are such that an exclusive-OR or exclusive-NOR function of said first and second data signals is provided in said optical output signal.

9. The invention of claim 3 wherein each of said data signals has first and second levels, wherein said method comprises the further step of applying a constant signal to an individual one of said electrodes, and wherein said interferometer, said first and second levels, and the level of said constant signal, are such that an exclusive-NOR or exclusive-OR function of said first and second data signals is provided in said optical output signal.

10. The invention of claim 1 wherein said first and second signals are respective data signals each at a data rate of B Gbit/s and having substantially zero phase offset relative to one another.

11. The invention of claim 10 wherein said first signal is a data signal and said second signal is a predefined cryptographic key signal.

12. The invention of claim 6 wherein said interferometer is a Mach-Zehnder interferometer.

13. Apparatus comprising an interferometer having
a first optical branch and a second optical branch coupled via an optical Y to an optical output waveguide to receive optical signals from the first and second optical branches,
a first pair of electrodes coupled to change the index of refraction of the first optical branch,
a second pair of electrodes coupled to change the index of refraction of the second optical branch, and
a source of independently generated first and second time varying electrical signals, each of said signals being coupled to a respective one of said first and second pairs of electrodes to provide to the first and second pairs of electrodes electrical signals which are other than substantially identical to each other and other than substantially in-phase inverses of each other.

14. The interferometer of claim 13 further comprising delay means coupled to said first pair of electrodes to delay the electrical signal to said first pairs of electrodes relative to the electrical signal to said second pairs of electrodes.

15. The interferometer of claim 14 wherein the signals provided by the source of independently generated electrical signals are each at a rate of B Gbit/s.

16. The interferometer of claim 14 wherein
the source of independently generated electrical signals provide electrical signals which are of substantially equal magnitude.

17. The interferometer of claim 13 wherein
the signals provided by the source of independently generated electrical signals are substantially equal in magnitude.

18. The interferometer of claim 15 further comprising
a source of optical signals coupled to direct optical energy to said first and second optical branches simultaneously, the first and second time varying electrical signals from said source causing changes in the index of refraction of the branches to cause the optical energy in the waveguides to experience optical phase shifts which add constructively and destructively in the optical output waveguide to form an optical signal of 2-B Gbit/s.

19. The interferometer of claim 18 wherein said source of optical signals is a CW source.

20. The interferometer of claim 18 further
comprising a receiver coupled to receive the optical signal of 2-B Gbit/s from the optical output waveguide and convert said received optical signal to an electrical signal.

21. The interferometer of claim 18 wherein the signals provided by the source of independently generated electrical signals are other than substantially identical to each other, and
a receiver coupled to receive the optical signal from the optical output waveguide to convert the received optical signal into two streams of electrical signals, one of the streams being similar to the first time varying electrical signal from the source of independently generated electrical signals and the other of the streams being similar to the second time varying electrical signal from the source of independently generated electrical signals.

* * * * *